(12) United States Patent
Xianyu et al.

(10) Patent No.: US 11,195,883 B2
(45) Date of Patent: Dec. 7, 2021

(54) OLED DISPLAY DEVICE COMPRISING TOUCH SENSOR, AND METHOD FOR MANUFACTURING SAME

(71) Applicant: WUHAN CHINA STAR OPTOELECTRONICS SEMICONDUCTOR DISPLAY TECHNOLOGY CO., LTD., Hubei (CN)

(72) Inventors: Wenxu Xianyu, Wuhan (CN); Wenliang Gong, Wuhan (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 76 days.

(21) Appl. No.: 16/629,567

(22) PCT Filed: May 13, 2019

(86) PCT No.: PCT/CN2019/086596
§ 371 (c)(1),
(2) Date: Jan. 9, 2020

(87) PCT Pub. No.: WO2020/191880
PCT Pub. Date: Oct. 1, 2020

(65) Prior Publication Data
US 2021/0020698 A1    Jan. 21, 2021

(30) Foreign Application Priority Data
Mar. 26, 2019  (CN) .......................... 201910233823.1

(51) Int. Cl.
*H01L 27/32* (2006.01)
*G06F 3/041* (2006.01)
(Continued)

(52) U.S. Cl.
CPC .......... *H01L 27/322* (2013.01); *G06F 3/0412* (2013.01); *H01L 27/323* (2013.01);
(Continued)

(58) Field of Classification Search
CPC combination set(s) only.
See application file for complete search history.

(56) References Cited

U.S. PATENT DOCUMENTS

2011/0290138 A1\* 12/2011 Kim .................... C09D 11/033
101/491
2016/0079314 A1\* 3/2016 Seo ....................... C09K 11/06
257/40

(Continued)

FOREIGN PATENT DOCUMENTS

| CN | 107359258 A | 11/2017 |
| CN | 107634149 A | 1/2018 |
| CN | 208569599 U | 3/2019 |

*Primary Examiner* — Nduka E Ojeh
(74) *Attorney, Agent, or Firm* — The Roy Gross Law Firm, LLC; Roy Gross

(57) ABSTRACT

An organic light emitting diode display device includes a substrate, a pixel defining layer disposed on the substrate and defining an opening, a first thin film encapsulation sublayer disposed on the pixel defining layer and in the opening, a color filter layer disposed in the opening, a second thin film encapsulation sublayer covering the first thin film encapsulation sublayer and the color filter layer, and a third thin film encapsulation sublayer disposed on the second thin film encapsulation sublayer.

9 Claims, 3 Drawing Sheets

(51) Int. Cl.
*H01L 51/52* (2006.01)
*H01L 51/00* (2006.01)

(52) U.S. Cl.
CPC ...... *H01L 27/3246* (2013.01); *H01L 51/5253* (2013.01); *H01L 51/5284* (2013.01); *H01L 51/0097* (2013.01); *H01L 2227/323* (2013.01)

(56) References Cited

U.S. PATENT DOCUMENTS

| | | | |
|---|---|---|---|
| 2017/0294424 A1* | 10/2017 | Jeong | H01L 33/62 |
| 2018/0013100 A1 | 1/2018 | Yim et al. | |
| 2018/0240822 A1* | 8/2018 | Lee | H01L 27/124 |
| 2019/0081275 A1 | 3/2019 | Jiao | |

\* cited by examiner

OLED DISPLAY DEVICE COMPRISING TOUCH SENSOR, AND METHOD FOR MANUFACTURING SAME

FIELD OF INVENTION

The present disclosure relates to a field of display technology, and more particularly, to an organic light emitting diode (OLED) display device and a method for manufacturing the same.

BACKGROUND

Because organic light emitting diode (OLED) display devices have advantages, such as light weight, thin thickness, self-illumination, short response times, wide viewing angles, wide color gamut, high brightness, and low power consumption among various types of display techniques, OLED display devices have attracted user attention in recent years.

To solve low contrast issues of OLED display devices due to a strong outdoor light environment, a polarizer is generally disposed on OLED display panels. However, the polarizer results in loss of over 55% of light emitted from the display panels. Moreover, polarizer is primarily made of polyvinyl alcohol (PVA), which is thick in thickness (about 100 μm) and is fragile, and thus it is likely that a polarizer is easily broken if it is bent, and cannot be used for dynamically bendable display products. By correspondingly forming a color filter layer or R, G, B photoresist layers in R, G, B sub-pixels of OLED displays, light emission of a light emitting layer is guaranteed to be over 60%. In the meanwhile, by forming a black matrix in a non-light-emitting area of the OLED displays, reflectivity of a panel can effectively be reduced to be lower than 6%. Such a technique is known as a polarizer-less (POL-less) technique.

However, the color filter layer or the R, G, B photoresist layers are formed on a thin film encapsulation layer. During a patterning process of the color filter layer, alkaline development liquid enters the thin film encapsulation layer, and affects OLED devices, resulting in defects in products and lowering manufacturing yield of products. In addition, four mask processes are required to fulfill patterning of the color filter layer. The patterning process is complicated. This makes the display devices to have a long time manufacturing process, and increases manufacturing costs.

Moreover, although use of the POL-less technique can mitigate light reflection issues, electrodes of touch sensors, which are made of metal, still cause light reflection in OLED display devices. The POL-less technique cannot completely solve the light reflection issues.

Therefore, there is a need to provide an organic light emitting diode (OLED) display device and a method for manufacturing the same in order to solve problems existing in prior art.

SUMMARY OF DISCLOSURE

Technical Problems

The objective of the present disclosure is to provide an organic light emitting diode (OLED) display device and a method for manufacturing the same in order to solve the problems existing in prior art, where display devices have poor flexibility, have low light transmittance, include complicated manufacturing process, and have light reflection problems.

Technical Solutions

To solve the aforementioned problems, the present disclosure provides an organic light emitting diode (OLED) display device, comprising:
a substrate;
a pixel defining layer disposed on the substrate and defining an opening;
a first thin film encapsulation sublayer disposed on the pixel defining layer and in the opening;
a color filter layer disposed in the opening;
a second thin film encapsulation sublayer covering the first thin film encapsulation sublayer and the color filter layer;
a third thin film encapsulation sublayer disposed on the second thin film encapsulation sublayer; and
a touch sensor disposed on the third thin film encapsulation sublayer, wherein the touch sensor comprises a first metal layer and a second metal layer, and each of the first metal layer and the second metal layer has a low light reflection film disposed on a top surface thereof.

In the OLED display device of the present disclosure, the OLED display device further includes a black bank layer stacked with the pixel defining layer, wherein the black bank layer and the pixel defining layer collectively define the opening and are made of a black matrix.

In the OLED display device of the present disclosure, the first thin film encapsulation sublayer and the third thin film encapsulation sublayer are made of an inorganic material, and the second thin film encapsulation sublayer is made of an organic material.

In the OLED display device of the present disclosure, the low light reflection film is made of a black matrix, chromium oxide, or molybdenum oxide.

In the OLED display device of the present disclosure, the color filter layer comprises a red color resist layer disposed in a red pixel area of the OLED display device, a green color resist layer disposed in a green pixel area of the OLED display device, and a blue color resist layer disposed in a blue pixel area of the OLED display device.

In addition, the present disclosure provides an organic light emitting diode (OLED) display device, comprising:
a substrate;
a pixel defining layer disposed on the substrate and defining an opening;
a first thin film encapsulation sublayer disposed on the pixel defining layer and in the opening;
a color filter layer disposed in the opening;
a second thin film encapsulation sublayer covering the first thin film encapsulation sublayer and the color filter layer; and
a third thin film encapsulation sublayer disposed on the second thin film encapsulation sublayer.

In the OLED display device of the present disclosure, the OLED display device further includes a black bank layer stacked with the pixel defining layer, wherein the black bank layer and the pixel defining layer collectively define the opening and are made of a black matrix.

In the OLED display device of the present disclosure, the first thin film encapsulation sublayer and the third thin film encapsulation sublayer are made of an inorganic material, and the second thin film encapsulation sublayer is made of an organic material.

In the OLED display device of the present disclosure, the OLED display device further includes a touch sensor disposed on the third thin film encapsulation sublayer, wherein the touch sensor comprises a first metal layer and a second metal layer, each of the first metal layer and the second metal layer has a low light reflection film disposed on a top surface thereof, and the low light reflection film is made of a black matrix, chromium oxide, or molybdenum oxide.

In the OLED display device of the present disclosure, the color filter layer comprises a red color resist layer disposed in a red pixel area of the OLED display device, a green color resist layer disposed in a green pixel area of the OLED display device, and a blue color resist layer disposed in a blue pixel area of the OLED display device.

Furthermore, the present disclosure provides a method for manufacturing an organic light emitting diode (OLED) display device, comprising steps of:

providing a substrate;

forming a pixel defining layer on the substrate, wherein the pixel defining layer defines an opening;

forming a first thin film encapsulation sublayer on the pixel defining layer and in the opening;

forming a color filter layer disposed in the opening using an ink-jet printing technique;

forming a second thin film encapsulation sublayer covering the first thin film encapsulation sublayer and the color filter layer; and forming a third thin film encapsulation sublayer on the second thin film encapsulation sublayer.

In the method for manufacturing the OLED display device of the present disclosure, the method further includes forming a black bank layer stacked with the pixel defining layer, wherein the black bank layer and the pixel defining layer collectively define the opening and are made of a black matrix.

In the method for manufacturing the OLED display device of the present disclosure, the first thin film encapsulation sublayer and the third thin film encapsulation sublayer are made of an inorganic material, and the second thin film encapsulation sublayer is made of an organic material.

In the method for manufacturing the OLED display device of the present disclosure, the method further includes forming a touch sensor on the third thin film encapsulation sublayer, wherein the touch sensor comprises a first metal layer and a second metal layer, and each of the first metal layer and the second metal layer has a low light reflection film disposed on a top surface thereof.

In the method for manufacturing the OLED display device of the present disclosure, the color filter layer comprises a red color resist layer disposed in a red pixel area of the OLED display device, a green color resist layer disposed in a green pixel area of the OLED display device, and a blue color resist layer disposed in a blue pixel area of the OLED display device.

Beneficial Effects

Compared to prior art, the present disclosure provides an organic light emitting diode (OLED) display device and a method for manufacturing the same. By embedding the color filter layer in the thin film encapsulation layer, a thickness of the OLED display device is reduced. This makes the OLED display device have more excellent flexibility and bending characteristics, and increases light transmittance of the OLED devices. In addition, the processes for forming the color filter layer and the thin film encapsulation layer are compatible with each other. It is easy to form the color filter layer of the present disclosure, thus shortening the manufacturing process of display devices and lowering the manufacturing costs of display devices without resulting in defects in products. Further, by forming a low light reflection film on top surface of the metal layer of the touch sensor, the light reflection problems of display devices existing in prior art are solved.

DETAILED DESCRIPTION

Figure 1A:
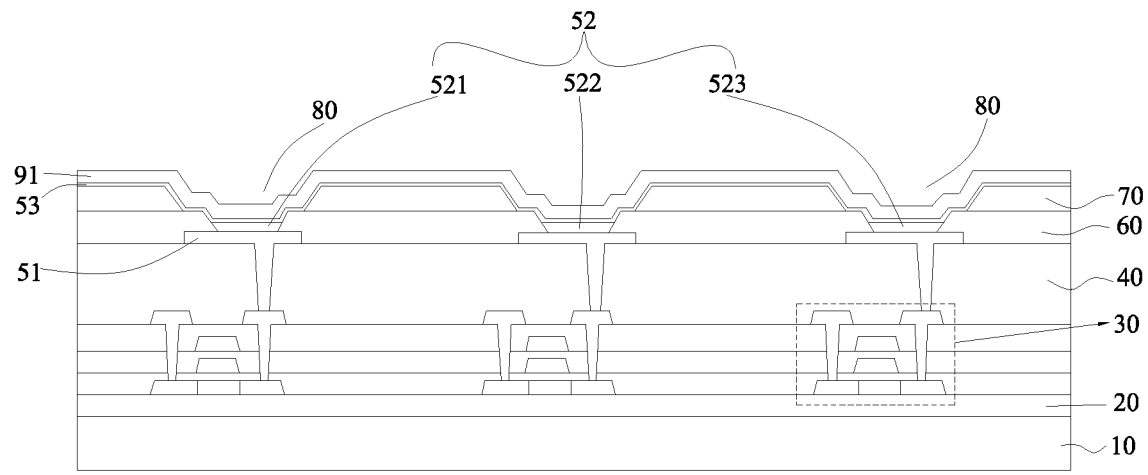
FIGS. 1A, 1B, 1C, 1D, and 1E show each step in a process flow of a method for manufacturing an organic light emitting diode (OLED) display device according to the present disclosure.

The following embodiments refer to the accompanying drawings for exemplifying specific implementable embodiments of the present disclosure. Moreover, directional terms described by the present disclosure, such as upper, lower, front, back, left, right, inner, outer, side, etc., are only directions by referring to the accompanying drawings, and thus the used directional terms are used to describe and understand the present disclosure, but the present disclosure is not limited thereto. In the drawings, the same reference symbol represents the same or similar components.

Please refer to FIGS. 1A to 1E, which show each step in a process flow of a method for manufacturing an organic light emitting diode (OLED) display device according to the present disclosure. The present disclosure provides the method for manufacturing the organic light emitting diode (OLED) display device. The method includes formation of a display panel and a touch panel. The method includes a lot of steps, as detailed below.

First, as shown in FIG. 1A, a substrate 10 is provided. A buffer layer 20, a thin film transistor (TFT) device 30, a planarization layer 40, and an anode 51 are formed on the substrate 10. To make the OLED display device have flexibility, the substrate could be a flexible substrate. For example, the substrate 10 is made of polyimide (PI).

Next, a pixel defining layer 60 and a black bank layer 70 are formed on the substrate 10, such that the black bank layer 70 is stacked with the pixel defining layer 60. The black bank layer 70 and the pixel defining layer 60 collectively define an opening 80. Therefore, a pixel area is thus defined thereby. The pixel area includes a red pixel area, a green pixel area, and a blue pixel area.

Thereafter, a light-emitting layer 52 is formed in the opening 80. The light-emitting layer 52 includes a red light-emitting layer 521, a green light-emitting layer 522, and a blue light-emitting layer 523. In one preferred embodiment, the red light-emitting layer 521, the green light-emitting layer 522, and the blue light-emitting layer 523 are respectively formed in the opening 80 of the red pixel area, in the opening 80 of the green pixel area, and in the opening 80 of the blue pixel area using the evaporation technique. In addition, a cathode 53 and a first thin film encapsulation sublayer 91 are formed on the pixel defining layer 60 and in the opening 80.

Figure 1B:
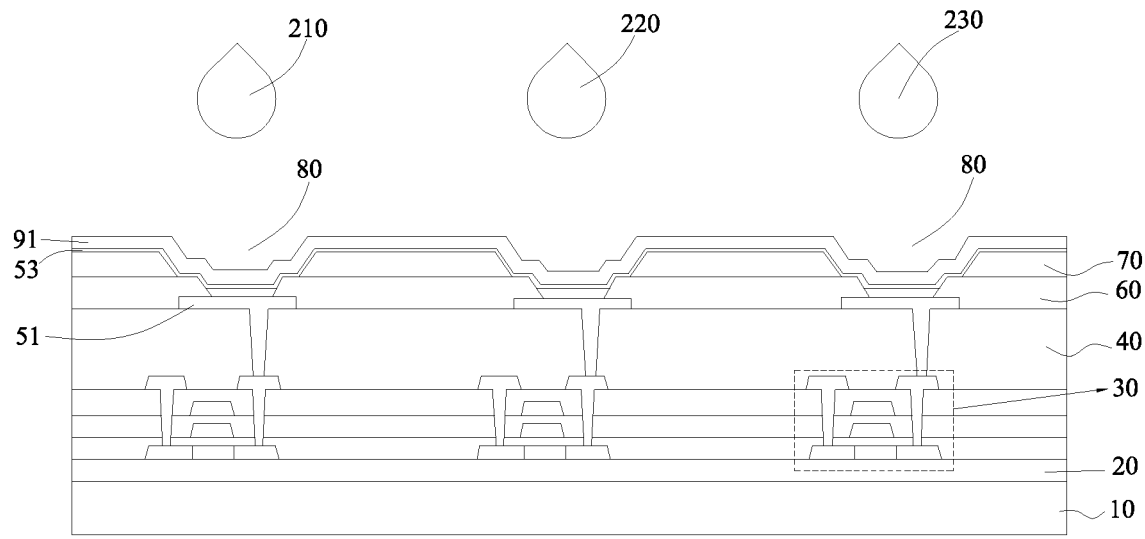
Figure 1C:
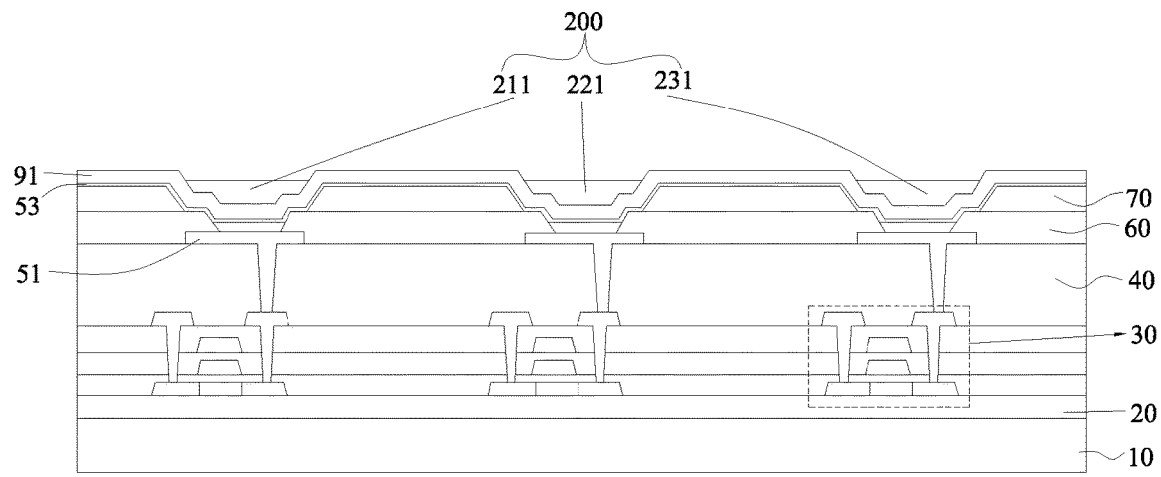

Then, as shown in FIGS. 1B-1C, a color filter layer 200 is formed in the opening 80 using the ink jet printing (IJP) technique. For example, the IJP technique is used to respectively print red ink droplets 210, green ink droplets 220, and blue ink droplets 230 in the opening 80 of the red pixel area, in the opening 80 of the green pixel area, and in the opening 80 of the blue pixel area. Thereafter, by irradiating the ink droplets using ultraviolet light or by performing a baking process (such as at a temperature of 90° C. or below 90° C.), the red ink droplets 210, the green ink droplets 220, and the blue ink droplets 230 are cured to respectively form a red color resist layer 211, a green color resist layer 221, and a blue color resist layer 231. In other words, the color filter layer 220 includes the red color resist layer 211 disposed in the red pixel area of the OLED display device, the green color resist layer 221 disposed in the green pixel area of the OLED display device, and the blue color resist layer 231 disposed in the blue pixel area of the OLED display device.

Figure 1D:
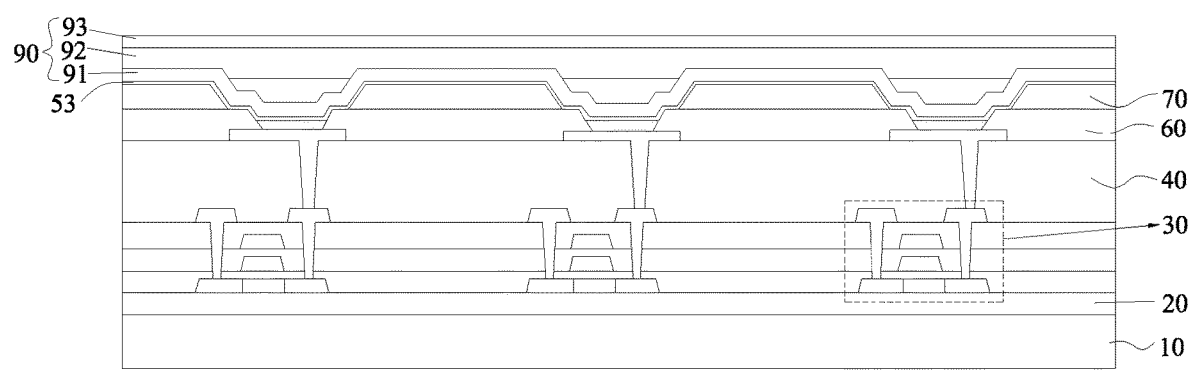
Figure 1E:
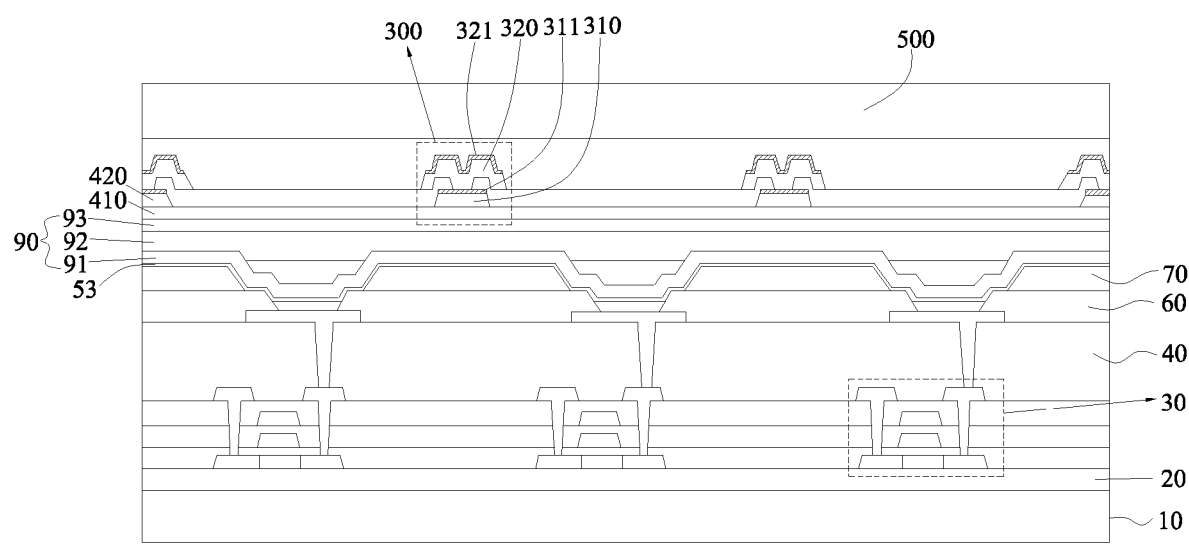

Subsequently, as shown in FIG. 1D, a second thin film encapsulation sublayer 92 is formed to cover the first thin film encapsulation sublayer 91 and the color filter layer 200. In addition, a third thin film encapsulation sublayer 93 is formed on the second thin film encapsulation sublayer 92.

In one preferred embodiment, the first thin film encapsulation sublayer 91 and the third thin film encapsulation sublayer 93 are made of an inorganic material, and the second thin film encapsulation sublayer 92 is made of an organic material. Because the inorganic material has a water-blocking and oxygen-blocking property, the inorganic material can prevent water and oxygen from entering and thus damaging OLED devices. Because the organic film could release stress, formation of the organic film makes the display device to have excellent flexibility.

The inorganic material could be $SiN_x$, $SiO_x$, SiON, or $AlO_x$. The organic material could be a photosensitive acrylic resin or a photosensitive methyl methacrylate resin. Plasma enhanced chemical vapor deposition (PECVD) or atomic layer deposition (ALD) can be used to form the inorganic material film, and an ink jet printing (IJP) technique can be used to form the organic material film.

The first thin film encapsulation sublayer 91, the second thin film encapsulation sublayer 92, and the third thin film encapsulation sublayer 93 together constitute a thin film encapsulation layer 90. The thin film encapsulation layer 90 protects the OLED devices, and has excellent flexibility.

In one preferred embodiment, the first thin film encapsulation sublayer 91 can include a plurality of inorganic material films. Alternatively, the first thin film encapsulation sublayer 91 is a multi-layer film including both organic material films and inorganic material films.

The first thin film encapsulation sublayer 91, the second thin film encapsulation sublayer 92, and the third thin film encapsulation sublayer 93 of the present disclosure are not limited to be made of any specific material. The material used to form the thin film encapsulation layer 90 depends on different display products. As long as the thin film encapsulation layer 90 functions to protect the OLED devices or have excellent flexibility, such material used to form the thin film encapsulation layer 90 falls within the scope intended to be covered by the present disclosure.

So far, manufacturing of the OLED display panel is finished.

However, to form a touch panel on the OLED display panel, the method further includes forming a touch sensor 300 on the third thin film encapsulation sublayer 93 as shown in FIG. 1D. The touch sensor 300 comprises a first metal layer 310 and a second metal layer 320, and each of the first metal layer 310 and the second metal layer 320 has a low light reflection film 311, 321 disposed on a top surface thereof.

Specifically, a first passivation layer 410 is formed on the third thin film encapsulation sublayer 93 first. Next, the first metal layer 310 is formed on the first passivation layer 410 using the photolithography technique, and the low light reflection film 311 is formed on the first metal layer 310 using the photolithography technique. Then, a second passivation layer 420 is formed on the first passivation layer 410 and the low light reflection film 311. Finally, the second metal layer 320 is formed on the second passivation layer 420 using the photolithography technique, and the low light reflection film 321 is formed on the second metal layer 320 using the photolithography technique.

In the end, a cover glass 500 is attached to the touch panel.

To this point, manufacturing of the OLED display device is ultimately completed.

In the present embodiment, the photolithography technique is used two times to respectively form the pixel defining layer 60 and the black bank layer 70. However, in one preferred embodiment, there is solely the pixel defining layer 60 formed. As long as the pixel defining layer 60 is thick enough to facilitate the ink droplets to be printed in the openings 80, the pixel defining layer 60 and the black bank layer 70 formed using the photolithography technique two times can be replaced with a single-layered pixel defining layer 60.

According to the present disclosure, the pixel defining layer 60 and the black bank layer 70 are disposed in the non-light-emitting area, therefore the pixel defining layer 60 and the black bank layer 70 can be made of a black matrix. The black matrix functions not only to shield light but to prevent reflection of light. The black matrix is composed of heat-sensitive or photosensitive polymers and black fillers, wherein the heat-sensitive or photosensitive polymers could be an acrylic resin or a methyl methacrylate resin, and the black fillers can be made of carbon black or an organic light absorbing material. In addition, the low light reflection film 311, 321 disposed on the top surface of the first metal layer 310 and the second metal layer 320 can be made of the black matrix as well, or can be made of chromium oxide or molybdenum oxide, which also functions not only to shield light but to prevent reflection of light.

As described above, the first thin film encapsulation sublayer 91, the second thin film encapsulation sublayer 92, and the third thin film encapsulation sublayer 93 together constitute a thin film encapsulation layer 90. The color filter layer 200 is formed to be sandwiched between the first thin film encapsulation sublayer 91 and the second thin film encapsulation sublayer 92. Both the second thin film encapsulation sublayer 92 and the color filter layer 200 can be formed using the IJP technique. Thus, the color filter layer 200 is embedded in the thin film encapsulation layer 90, and the processes for forming the two layers are compatible with each other. In addition, because the color filter layer 200 is embedded in the thin film encapsulation layer 90, a total thickness of the color filter layer 200 and the thin film encapsulation layer 90 is reduced when compared to that formed according to prior art, thus making the OLED display devices more flexible and have more excellent bending characteristics. Moreover, because of the reduced thickness, light transmittance of the OLED display devices is increased to be about 60%.

Additionally, the color filter layer 200 is formed using the IJP technique. Compared to the color filter layer formed according to prior art which employs four mask processes, it is easier to form the color filter layer of the present disclosure, thus shortening the manufacturing process of display devices and lowering the manufacturing costs of the display devices. Be noted that, according to the present disclosure, there is no need to use the development liquid during formation of the color filter layer, the method of the present disclosure will not affect OLED devices and result in defects in products.

Furthermore, the present disclosure provides an organic light emitting diode (OLED) display device. The OLED device includes:

a substrate 10;

a pixel defining layer 60 disposed on the substrate 10 and defining an opening 80;

a first thin film encapsulation sublayer 91 disposed on the pixel defining layer 60 and in the opening 80;

a color filter layer 200 disposed in the opening 80;

a second thin film encapsulation sublayer 92 covering the first thin film encapsulation sublayer 91 and the color filter layer 200;

a third thin film encapsulation sublayer 93 disposed on the second thin film encapsulation sublayer 92.

According to one embodiment of the present disclosure, the OLED display device can further include a black bank layer 70 stacked with the pixel defining layer 60. The black bank layer 70 and the pixel defining layer 60 collectively define the opening 80.

According to one embodiment of the present disclosure, the first thin film encapsulation sublayer 91 and the third thin film encapsulation sublayer 93 are made of an inorganic material, and the second thin film encapsulation sublayer 92 is made of an organic material.

According to one embodiment of the present disclosure, the OLED display device can further include a touch sensor 300. The touch sensor 300 is disposed on the third thin film encapsulation sublayer 93. The touch sensor 300 comprises a first metal layer 310 and a second metal layer 320, and each of the first metal layer 310 and the second metal layer 320 has a low light reflection film 311, 321 disposed on a top surface thereof.

According to one embodiment of the present disclosure, the color filter layer 200 includes a red color resist layer 211 disposed in a red pixel area of the OLED display device, a green color resist layer 221 disposed in a green pixel area of the OLED display device, and a blue color resist layer 231 disposed in a blue pixel area of the OLED display device.

Compared to prior art, the present disclosure provides an organic light emitting diode (OLED) display device and a method for manufacturing the same. By embedding the color filter layer in the thin film encapsulation layer, a thickness of the OLED display device is reduced. This makes the OLED display device to have more excellent flexibility and bending characteristics, and increases light transmittance of the OLED devices. In addition, the processes for forming the color filter layer and the thin film encapsulation layer are compatible with each other. It is easy to form the color filter layer of the present disclosure, thus shortening the manufacturing process of display devices and lowering the manufacturing costs of the display devices without resulting in defects in products. Further, by forming a low light reflection film on the top surface of the metal layer of the touch sensor, the light reflection problems of the display devices existing in prior art are solved.

While the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:

1. An organic light emitting diode (OLED) display device, comprising:

a substrate;

a pixel defining layer disposed on the substrate and defining an opening;

a first thin film encapsulation sublayer disposed on the pixel defining layer and in the opening;

a color filter layer disposed in the opening;

a second thin film encapsulation sublayer covering the first thin film encapsulation sublayer and the color filter layer;

a third thin film encapsulation sublayer disposed on the second thin film encapsulation sublayer; and a touch sensor disposed on the third thin film encapsulation sublayer, wherein the touch sensor comprises a first metal layer and a second metal layer, and each of the first metal layer and the second metal layer has a low light reflection film disposed on a top surface thereof.

2. The OLED display device according to claim 1, further comprising:

a black bank layer stacked with the pixel defining layer, wherein the black bank layer and the pixel defining layer collectively define the opening and are made of a black matrix.

3. The OLED display device according to claim 1, wherein the first thin film encapsulation sublayer and the third thin film encapsulation sublayer are made of an inorganic material, and the second thin film encapsulation sublayer is made of an organic material.

4. The OLED display device according to claim 1, wherein the low light reflection film is made of a black matrix, chromium oxide, or molybdenum oxide.

5. The OLED display device according to claim 1, wherein the color filter layer comprises a red color resist layer disposed in a red pixel area of the OLED display device, a green color resist layer disposed in a green pixel area of the OLED display device, and a blue color resist layer disposed in a blue pixel area of the OLED display device.

6. A method for manufacturing an organic light emitting diode (OLED) display device, comprising steps of:

providing a substrate;

forming a pixel defining layer on the substrate, wherein the pixel defining layer defines an opening;

forming a first thin film encapsulation sublayer on the pixel defining layer and in the opening;

forming a color filter layer disposed in the opening using an ink-jet printing technique;

forming a second thin film encapsulation sublayer covering the first thin film encapsulation sublayer and the color filter layer;

forming a third thin film encapsulation sublayer on the second thin film encapsulation sublayer; and forming a touch sensor on the third thin film encapsulation sublayer, wherein the touch sensor comprises a first metal layer and a second metal layer, and each of the first metal layer and the second metal layer has a low light reflection film disposed on a top surface thereof.

7. The method for manufacturing the OLED display device according to claim 6, further comprising:

forming a black bank layer stacked with the pixel defining layer, wherein the black bank layer and the pixel defining layer collectively define the opening and are made of a black matrix.

8. The method for manufacturing the OLED display device according to claim 6, wherein the first thin film encapsulation sublayer and the third thin film encapsulation sublayer are made of an inorganic material, and the second thin film encapsulation sublayer is made of an organic material.

9. The method for manufacturing the OLED display device according to claim 6, wherein the color filter layer comprises a red color resist layer disposed in a red pixel area of the OLED display device, a green color resist layer disposed in a green pixel area of the OLED display device, and a blue color resist layer disposed in a blue pixel area of the OLED display device.

\* \* \* \* \*